US008835749B2

(12) United States Patent
Blong et al.

(10) Patent No.: US 8,835,749 B2
(45) Date of Patent: Sep. 16, 2014

(54) MULTILAYER FILM

(75) Inventors: Thomas J. Blong, Woodbury, MN (US); Robert F. Babb, Easley, SC (US); Peter J. Harrison, Hudson, WI (US); Pamela A. Percha, Woodbury, MN (US)

(73) Assignee: 3M Innovative Properties Company, Saint Paul, MN (US)

(*) Notice: Subject to any disclaimer, the term of this patent is extended or adjusted under 35 U.S.C. 154(b) by 627 days.

(21) Appl. No.: 12/044,359

(22) Filed: Mar. 7, 2008

(65) Prior Publication Data

US 2008/0216889 A1    Sep. 11, 2008

Related U.S. Application Data

(60) Provisional application No. 60/894,063, filed on Mar. 9, 2007.

(51) Int. Cl.
| H01L 31/042 | (2014.01) |
| H02N 6/00 | (2006.01) |
| H01L 31/048 | (2014.01) |
| B32B 27/08 | (2006.01) |
| B32B 27/20 | (2006.01) |
| B32B 27/36 | (2006.01) |

(52) U.S. Cl.
CPC ............ *H01L 31/0487* (2013.01); *B32B 27/08* (2013.01); *B32B 27/20* (2013.01); *B32B 27/36* (2013.01); *Y02E 10/52* (2013.01)
USPC .......................................... 136/251; 136/244

(58) Field of Classification Search
CPC ..... H01L 31/0487; Y02E 10/52; B32B 27/08; B32B 27/20; B32B 27/36
USPC ............................ 136/244, 246, 251, 252, 259
See application file for complete search history.

(56) References Cited

U.S. PATENT DOCUMENTS

| 6,020,056 | A | 2/2000 | Walker et al. | |
| 6,121,542 | A | 9/2000 | Shiotsuka et al. | |
| 6,268,235 | B1 | 7/2001 | Sakakura et al. | |
| 6,319,596 | B1 | 11/2001 | Kernander et al. | |
| 6,407,329 | B1* | 6/2002 | Iino et al. | 136/251 |
| 6,441,299 | B2 | 8/2002 | Otani et al. | |
| 6,569,517 | B1 | 5/2003 | McGurran et al. | |
| 6,660,930 | B1* | 12/2003 | Gonsiorawski | 136/251 |
| 6,818,293 | B1 | 11/2004 | Keep et al. | |
| 7,638,186 | B2* | 12/2009 | Hull et al. | 428/220 |
| 2004/0202866 | A1 | 10/2004 | Kernander et al. | |
| 2006/0121299 | A1 | 6/2006 | Hashimoto et al. | |
| 2006/0280922 | A1* | 12/2006 | Hull et al. | 428/213 |
| 2007/0012352 | A1 | 1/2007 | Wohlgemuth et al. | |
| 2007/0224434 | A1* | 9/2007 | Osada et al. | 428/480 |
| 2008/0216889 | A1 | 9/2008 | Blong et al. | |

FOREIGN PATENT DOCUMENTS

| EP | 1 102 330 | 5/2001 |
| EP | 1 741 550 | 1/2007 |
| JP | 2006-270025 | 10/2006 |
| WO | WO 2005095097 | 10/2005 |

OTHER PUBLICATIONS

Gupta et al. "The effect of heat setting on the structure and mechanical properties of Poly(ethylene Terephthalate) fiber. I. Structural changes." Journal of Applied Polymer Science, vol. 26, 1865-1876 (1981).*
Gohil, Ramesh M., "Morphology-Property Relationship in Oriented PET Films: Microstructural Reorganization during Heat Treatment," *Journal of Applied Polymer Science*, vol. 52, (1994), pp. 925-944.
Lu, X. F., "Isothermal Crystallization Kinetics and Melting Behaviour of Poly(ethylene terephthalate)," *Polymer*, vol. 42, (2001), pp. 9423-9431.
Oreski, G., "Delamination Behaviour of Multi-layer Films for PV Encapsulation," *Solar Energy Materials & Solar Cells*, vol. 89, (2005), pp. 139-151.
Plessing, Albert K., "Performance of Encapsulating Systems," 19$^{th}$ European Photovoltaic Solar Energy Conference, Jun. 7-11, 2004, pp. 2153-2155.
Smith, Leslie E., "Factors Governing the Long-term Stability of Polyester-based Recording Media," *Restaurator*, vol. 12, (1991) pp. 201-217.

\* cited by examiner

*Primary Examiner* — Jonathan Johnson
*Assistant Examiner* — Lindsey Bernier
(74) *Attorney, Agent, or Firm* — 3M Innovative Properties Company; Carlos M. Téllez

(57) ABSTRACT

A solar panel backside film used in solar panel constructions. The film comprises a PET film having a net peak area as measured by differential scanning calorimetry of about −15 J/g to about 5 J/g measured from the endpoint of the glass transition (Tg) up to 230° C., and an additive to opacify the PET film. A polymeric layer is adhered to the PET film to create a solar panel backside film. The solar panel backside film generally has a reflectivity of 50% or greater at a point in the visible range of light. Additionally, the solar panel backside film, when applied to a solar panel and exposed to 2000 hours at 85° C. and 85% relative humidity, does not result in exfoliation or visible cracks in the PET film.

17 Claims, No Drawings

MULTILAYER FILM

CROSS REFERENCE TO RELATED APPLICATION

This application claims the benefit of U.S. Provisional Patent Application No. 60/894,063, filed Mar. 9, 2007, the disclosure of which is incorporated by reference herein in its entirety.

TECHNICAL FIELD

This invention relates to PET films or laminates, and methods for their manufacture that are useful as backside films for solar modules.

BACKGROUND

Solar panel backside films are often used to enhance the durability, longevity, and performance of photovoltaic modules placed in a solar panel. Solar panel backside films are often multilayer films or laminate constructions which attempt to marry the properties of dissimilar materials in order to provide an improved performance. Such properties include barrier resistance to elements such as water, cut-through resistance, weathering resistance and electrical insulation. In addition, the reflectivity of solar panel backside films can improve the power output of the solar module. Previous laminates have addressed many of the needs for solar modules, but often result in a misbalance of properties, are more expensive, or difficult to handle or process. In addition, the inner layers of the multilayer film are often not fully protected over the life of the module.

In order to improve the durability, longevity and performance of photovoltaic modules, laminates are being developed with thicker layers of barrier materials such as (polyethylene terephthalate (hereinafter "PET") or resort to the use of metal foils, inorganic coatings, or multiple layers of polymers including fluoropolymers. These endeavors typically result in constructions, which are often more expensive, and that do not necessarily improve the performance of the solar module.

SUMMARY

There is a need for improved PET films to construct opaque, reflective, low shrink solar backside films that maintain their physical and mechanical integrity and do not crack or exfoliate during extended exposure to environmental conditions such as heat and moisture. The addition of pigments to increase the opacity and reflectivity to such PET films typically has a negative effect on their environmental longevity. As well, efforts to reduce the shrinkage of the PET film can also detract from its service life.

Briefly, the present invention is directed to a solar panel backside film to address the deficiencies of conventional films used in solar panel constructions. The films of the present invention comprise a PET film having a net peak area as measured by differential scanning calorimetry of about −15 J/g to about 5 J/g measured from the endpoint of the glass transition (Tg) up to 230° C., and an additive to opacity the PET film. A polymeric layer is adhered to the PET film to create a solar panel backside film. The solar panel backside film generally has a reflectivity of 50% or greater at a point in the visible range of light. Additionally, the solar panel backside film, when applied to a solar panel and exposed to 2000 hours at 85° C. and 85% relative humidity, does not result in exfoliation or visible cracks in the PET film.

In another embodiment of the invention, the solar panel backside film comprises a PET film having an intrinsic viscosity of 0.65 or greater bonded to a polymeric layer. This film, when applied to a solar panel and exposed to 2000 hours at 85° C. and 85% relative humidity, does not result in exfoliation or visible cracks in the PET film.

Another embodiment includes a method for preparing the films of the present invention. The present invention also provides for a solar panel utilizing the specific solar panel backside film to enhance the durability and longevity of the solar panel.

Other features and advantages of the invention will be apparent from the following detailed description of the invention and the claims. The above summary of principles of the disclosure is not intended to describe each illustrated embodiment or every implementation of the present disclosure. The following details more particularly exemplify certain preferred embodiments utilizing the principles disclosed herein.

DETAILED DESCRIPTION

The present invention is a solar panel backside film with improved properties comprising a polyethylene teraphthalate film bonded to a polymeric layer. The PET film provides increased durability and longevity, and performance enhancements to photovoltaic modules when it is utilized as a backside film on the modules. The solar panel backside film is a multilayer structure that, in its base from, encompasses a PET film and a polymeric layer adhered to the PET film. The PET film has a net peak area as measured by differential scanning calorimetry of about −15 J/g to about 5 J/g measured from the endpoint of the glass transition point up to 230° C. Additionally, the PET film includes an additive to opacify the film. In the production of the PET films, the product of the stretching in the machine direction times the stretching in the transverse direction can be referred to as the stretch area. This stretch area is typically greater than about 11, preferably greater than 12. It may be greater than 12.5 or greater than 13.

PET Films

In general, PET films suitable for use with the present invention can be made by a well-known process referred to as tentering, which orientates the molecular structure of the film. The film may be either sequentially or simultaneously biaxially oriented by conventionally recognized techniques. The net peak area for the PET film measured from the endpoint of the glass transition up to 230° C. can be altered by the process parameters used to make the PET film. In particular, the temperatures, residence times and air velocities in various zones including the heat set and cooling zones of a PET film tentering line can be used to adjust this property. Heat set temperatures are preferable below 240° C. and more preferably 230° C. or lower. If the heat set conditions are too low, the resultant film might not be sufficiently or properly crystallized. The draw ratios in the machine and transverse direction can be used to achieve various properties desired in the PET film.

For purposes of the invention, the PET film samples may be analyzed using a TA Instruments model 2920 Modulated® Differential Scanning Calorimeter (MDSC). A linear heating rate of 4° C./min. is applied with a perturbation amplitude of +/−0.636° C. every 60 seconds. The specimens are subjected to a heat profile over a temperature range of −10 to 300° C. This generates three signals designated as heat flow, reversing heat flow and non-reversing heat flow.

The endpoint of the glass transition may be determined by the analysis software using the reversing heat flow signal. A linear baseline between this endpoint and the return to the baseline after the major melting transition is used to integrate the heat flow signal. The net peak area between the glass transition endpoint and 230° C. for the heat flow signal may then be evaluated for each sample. The peak area integration results are normalized for sample weight and reported in Joules/gram (J/g). The integration end is chosen at 230° C. which is prior to the onset of major melting.

Using the convention of describing exothermic peaks as positive numbers, and endothermic peaks as negative values, the integration results for the temperature region from the endpoint of Tg up to 230° C. can then be utilized to compare individual PET films. Films of the invention typically include minor peaks in the region between the endpoint of the glass transition to 230° C. with net peak areas ranging from about −15 J/g to about 5 J/g, preferably from about −7 J/g to 0 J/g. Preferred PET films do not exhibit an exothermic cold-crystallization peak around 125-130° C. PET films of the present invention preferably exhibit minor endothermic peaks prior to 230° C., or net endothermic peak areas with the heat flow curve approximating the linear integration baseline.

The PET film produced in accordance with the present invention is combined with another polymeric layer. In that regard, substantial shrinkage of the PET film after combination with a polymeric layer may adversely affect the final properties of the intended solar panel backside film. Significant shrinkage may even cause wrinkling of the solar panel backside film. Therefore, the shrinkage in the PET film is preferably about 1% or less, and depending on the application most preferably less than 0.5%. Shrinkage is measured at 150° C. for 15 minutes as specified per ASTM 2305-02. As the temperatures and/or residence times in the heat set zones are decreased, the shrinkage of the PET film will tend to increase and eventually steps may be needed to counteract this increase. The shrinkage can be controlled to some extent by the orientation and constraint placed on the film during the manufacturing process. It is also possible to reduce shrinkage by exposing the PET film to additional heat treatments, either immediately after the heat setting or in a post secondary process. Preferably the temperature used is lower than the temperature used in the original heat setting process and the PET film should be somewhat or entirely unconstrained to allow the shrinkage to be removed. Preferred temperatures for reducing the heat shrink in roll to roll, continuous or batch processes are usually in the range of 140° C. to 220° C. The shrinkage of the PET film may also be reduced after other layers are adhered to make a solar module backside film, but it is usually preferable to remove the film shrinkage prior to applying the material to the PET film.

PET films of the invention generally have a thickness of greater than about 1 mil, preferably greater than 2 mils or more. In another embodiment, PET film may also be formed from multiple layers of PET. Thin PET layers by themselves may not be able to withstand mechanical forces in end use application which can lead to cracking of the PET film.

Opacification of the PET film is preferable to achieve a desired level of reflectivity in the solar panel backside film. A variety of additives, in combination or alone, may be used to opacify the PET, including inorganics such as $CaCO_3$, ZnO, $BaSO_4$ or $TiO_2$. Preferred are those that do not induce excessive micro-voiding within the PET film. By micro-voiding it is meant that small voids or cavities can form within the film. This micro-voiding can contribute to the opacity of the film but may also weaken it. If excessive, it can contribute to exfoliation of the film during environmental aging. Exfoliation means that the PET film fails within itself through a cohesive mechanism wherein layers or pieces of the film are readily removed from the PET film. The extent of micro-voiding can also be affected by the PET film making conditions; molecular orientation, heat set temperatures and lower molecular weight PET, all of which can render the PET film more susceptible to exfoliation.

A preferred additive for opacifying the PET film is $TiO_2$. As previously noted, $BaSO_4$ can also be used to opacify the film, but under certain conditions and/or levels it can contribute to exfoliation of the PET film. Preferably the PET film is at least 50% opaque and typically contains at least 5% by weight of an additive with levels up to 10% or more often being employed. The overall opacity of the solar module backside film is usually 80% or greater, often up to 90% or even 95% and above. The opacity of the solar module backside film may be achieved by the PET film alone or through the addition of other opaque layers, pigmented or otherwise. Opacified layers positioned to either side of the PET film can be utilized to provide UV protection to the underlying PET film.

Exfoliation of the PET film can readily be determined by sufficiently adhering it to a polymer layer and then aging the laminate in damp heat. Damp heat conditions are defined as 85° C. and 85% relative humidity. After a period of aging in the damp heat, the interlayer adhesion of the PET film to the other polymer can be assessed by peeling the two films apart. PET films that exfoliate will generally have an interlayer adhesion value of 1 pli or less as measured via the Peel Test described in the experimental section. If the PET film exfoliates, the exposed surface interface of the polymer to which it was adhered will show remnants of the PET film. Typically this can be assessed visually or via surface analytical techniques such as Electron Spectroscopy for Chemical Analysis (ESCA). Preferably, the PET film adhered to the second polymer does not readily exfoliate after damp heat exposure of 2000 hours or more and the failure mechanism is through adhesive failure or cohesive failure within the second polymer. In some instances, the PET film may crack, tear or otherwise break, especially if it is weaker than the material to which it is bonded. This is not necessarily interpreted as exfoliation. The adhesion mechanism used for the test should be capable of withstanding the damp heat for an extended duration.

Opacifying additives can typically be added via commercially obtained concentrates, or compounded via methods well known in the art. Alternatively, they can be added to the PET during polymerization. Both the additive and the carrier resin, if a concentrate is used, can sometimes detract from the hydrolytic life of the PET film. Improvement of the additive dispersion within the PET film can lessen its impact.

It is generally recognized in the art that the PET extrusion conditions may further degrade the performance of the PET film. The intrinsic viscosity (IV), of the opacified PET film may be at least 0.5, preferably 0.55 or greater and may be as high as 0.6, 0.62 or 0.65. In other embodiments the film IV may be as great as 0.7 or even 0.8 and greater. As the IV is increased, the requirements for PET film manufacture can become more demanding. Film and resin IV can be readily measured by techniques well known in the art. Commercially available resins with a wide range of IV's are available, such as from E. I. du Pont de Nemours and Company; Wilmington Del., Invista, Wichita, Kans.; or Eastman Chemical Company, Kingsport, Tenn. As well, resins of varying IV can be blended to achieve a particular IV. In addition, the use of recycle or edge-trim from the PET film making process or resins which have seen previous thermal exposure can negatively affect the performance of the PET film. Preferably, the amount of recycle PET resin is less than 50%. Techniques such as solid state polymerization are applicable for mitigating the deleterious affects of re-using materials with previous thermal history or lower IV. PET resins used to make the film are those generally known in the art and may contain other additives, stabilizers, and end-capping agents. Preferably they do not contain branching agents.

When the IV of the PET film is 0.65 or greater, the opacity may also be provided by incorporating other layers within the solar panel backside film. These layers may be positioned on either side of the PET film. Alternatively, films according to the present invention may exclude additives to opacity the film. The teachings herein for opacified films may be applicable to films without such additives or opacifying layers. The resulting film may be suitable as solar panel front side films.

Polymeric Layer

The polymeric layer is generally applied as a weatherable layer to extend the functional life of the solar panel backside film, but may be a layer applied to either side of the PET film. The polymeric layer may comprise any polymer that is capable of withstanding environmental conditions. Various types of materials may be used as the polymeric layer. Preferably, the backside film contains a layer or means to protect the PET film and/or inner layers or other components of the solar module from environmental exposure such as UV and the elements. A preferred layer is comprised of fluoropolymers, including, but not limited to, homopolymers and copolymers of vinyl fluoride, vinylidene fluoride, chlorotrifluoroethylene tetrafluoroethylene or combinations thereof with other non-fluorinated, partially or fully fluorinated monomers. Examples of suitable fluoropolymers include polyvinylfluoride, available as Tedlar from E. I. du Pont de Nemours and Company, Wilmington Del., and polymers such as polyvinylidene fluoride, ethylene-co-tetrafluoroethylene polymers, or copolymers of tetrafluoroethylene, hexafluoropropylene or vinylidene fluoride from Dyneon LLC (Oakdale, Minn.).

The polymeric layer combined with the PET film may also comprise materials which are used to encapsulate the solar cells such as polyolefins, including ionomers and EVA resins. In addition, the solar panel backside film may be formed in the same lamination step that is used to produce a solar module. Any of the polymeric layers may contain pigments, fillers, cross linking agents, stabilizers and other modifying additives.

Solar Panel Backside Film

The PET film and the polymeric layer are generally combined to form a solar panel backside film.

Examples of multilayer solar module backside films include, but are not limited to: (1) a four layer construction comprising a fluoropolymer layer, an adhesive, a PET film and a polyolefin layer; (2) a three layer construction comprising a UV protective layer adhered to the PET film adhered to a layer of polymer which can also serve as solar cell encapsulant; (3) a second layer of PET adhered to the PET film and (4) a PET film adhered to a polyolefin. All embodiments of course will be capable of bonding to a solar module. The thickness of the individual layers within the multilayer film can be varied and tailored per the end-use application requirements.

Optionally, any number of additional layers may be adhered to the Solar Panel backside film. An additional layer may be considered as a primer, adhesives, coatings, scrim, mesh, foil or another polymer, including vapor deposited materials such as metal oxides to enhance barrier properties. These layers may be adhered to either the PET film or second polymer layer or be position between the two.

In many instances, coatings, primers, adhesives, barrier coatings or layers, or similar agents may be present at the interface between the PET film and the polymer layer. The exfoliation after damp heat aging is interpreted similarly if remnants of the PET are removed from the PET film surface and can be detected on the failure interface opposite the PET film. The laminate of PET film and another polymer will preferably exhibit a peel-strength of at least 1 pli, (pounds per linear inch) after the duration of damp heat exposure, preferably 1.5 pli up to 2 pli or more.

To be most useful, the solar panel backside films of the present invention should not delaminate during use. That is, the adhesive bond strength between the different layers of should be sufficiently strong and stable so as to prevent the different layers from separating on exposure to, for example, moisture, heat, cold, wind, chemicals and or other environmental exposure. Various methods of increasing interlayer adhesion in all cases are generally known by those of ordinary skill in the art.

A variety of methods have been employed to bond the polymeric materials of the present invention. For example, the layers can be adhesively bonded together by a layer of adhesive material between the two layers. Alternatively, surface treatment of one or both of the layers, used independently or in conjunction with adhesive materials, has been used to bond the two types of materials together. For example, layers comprising a fluoropolymer have been treated with a charged gaseous atmosphere followed by lamination with a layer of a non-fluorinated polymer. As another approach, "tie-layers" have been used to bond a fluoropolymer material to a layer of material comprising a substantially non-fluorinated polymer.

A tie layer method for improving interlayer adhesion with the fluoropolymer comprises blending a base and an aromatic material such as a catechol novolak resin, a catechol cresol novolak resin, a polyhydroxy aromatic resin (optionally with a phase transfer catalyst) with the fluoropolymer and then applying to either layer prior to bonding. Alternatively, this composition may be used as the fluoropolymer layer without separate tie layer as disclosed in U.S. Pat. No. 6,911,512, herein incorporated by reference in its entirety.

Another tie layer method for bonding fluoropolymers is the use of a combination of a base, a crown ether and a non-fluoropolymer. This method is disclosed in U.S. Pat. No. 6,767,948, herein incorporated by reference in its entirety.

Another method that may be used as a tie layer or as a primer for bonding fluoropolymers involves the use of an amino substituted organosilane. The method is fully disclosed in U.S. Pat. No. 6,753,087, herein incorporated by reference in its entirety. The organosilane may optionally be blended with a functionalized polymer.

Adhesion between layers may also be accomplished in a variety of ways including the application of anhydride or acid modified polyolefins, the application of silane primers, utilization of electron beam radiation, utilization of ultraviolet light and heat, corona treatments or combinations thereof.

Those of ordinary skill in the art are capable of matching the appropriate conventional bonding techniques to the selected multilayer materials to achieve the desired level of interlayer adhesion.

The resulting solar module backside film comprising a PET film and a polymer layer has a reflectivity of at least 50% at a point in the visible range of light or within a range of about 450 to about 700 nm and more preferably over the majority of the light range which can be utilized by a solar cell to generate electricity. More preferred, the solar module backside film may have a reflectivity of 70% or 80% or more. The reflectivity may be contributed in part or augmented by other layers in the solar module backside film. Preferably, the PET film itself provides a majority of the reflectivity.

The incorporation of opacifying additives may mechanically weaken the PET film leading to pre-mature embrittlement when exposed to environmental conditions. Embrittlement of the film is witnessed by the eventual cracking of the PET film during damp heat exposure when laminated to the back of a solar module as a solar module backside film. The solar panel backside film can be assessed by bonding the film to a glass panel or solar module and subjecting the construction to the same previously described damp heat conditions. At the end of the test period, the construction is removed from the damp heat and allowed to cool to ambient. If the PET film does not retain sufficient properties, it will exhibit cracks. These cracks will be visible to the eye, especially if the PET film is not covered with other layers of opaque materials. Preferably, the PET film, when laminated to the backside of a solar module as a solar module backside film will not crack after 2000 hours of exposure to the damp heat.

The PET film can also be extracted from the solar panel backside film after damp heat aging and its mechanical properties measured. Preferably, the PET film after the 2000 hours of damp heat exposure will have at least 2% elongation to break, more preferred 5% or even 10% or more. The test method for measuring elongation break is described in the examples section.

Solar Module

A solar module or panel typically comprises a layer of glass with one or more elements capable of generating electricity via the photoelectric effect. The elements are electrical connected and typically encapsulated in a polymer to isolate and adhere them to the glass. The solar module backside film is adhered behind the electron generating elements to form the solar module. The Solar panel backside film may be adhered directly to an encapsulant material or by through other conventional means such as tie layers or adhesive layers. The build up of the solar module utilizing the solar panel backside film of the present invention is accomplished through conventional means.

EXAMPLES

The following test procedures are used in conjunction with the present invention:

Reflectivity: Reflectivity was measured as Total Luminous Reflectance (TLR) at eight degrees incidence. Measurements were made on a Perkin Elmer Lambda 950 instrument fitted with a 150 mm integrating sphere accessory, per ASTM E903.

Peel Testing: Peel testing was per ASTM D1876-02 using an Instron tensometer, model 5564 with Merlin software package. Samples of film were cut to ½" wide×6" length. The peel interface was started and peeled ~1". The peeled PET layer was placed in the lower jaw. The polymer layer was placed in the upper jaw. Samples were peeled at 6 in/min for a crosshead travel length of 6 inches. Average peel value in N/cm and pli is reported via an integral calculation performed on the most stable part of the load vs. extension curve. Results are reported as an average of 5 samples.

Elongation to break testing: can be measured per ASTM D882 at an extension rate of 2 inches/min using ½ inch samples and averaging the results of at least 5 specimens.

Comparative Example 1

A commercially available 3 mil white opaque PET film designated as WDW from Mitsubishi, Greer, S.C., was subjected to damp heat conditions of 85° C. and 85% relatively humidity. Its elongation to break was measured every 10 days. At 70 days, the film had no measurable elongation and readily cracked. The net peak area from Tg endpoint to 230° C. was 15 J/g.

Comparative Example 2

A sample of opaque, white PET film designated as Melinex 329 from E. I. du Pont de Nemours and Company; Wilmington Del., was tested as in comparative example 1. The last measurable elongation to break value was 1.8% at 50 days.

PET Film Preparation

PET film example 1: PET film was made on a production scale tentering line. The base resin was a polymer of DMT and ethylene glycol with an initial IV of about 0.59. To which was added 15% of a 0.74 IV, Eastapak 7352 PET resin, about 13% of TiO2 from a 50% concentrate and 1% of OB-1 optical brightener via a masterbatch all from Eastman Chemical Co, Kingsport, Tenn. All percentages are given as weight percentages of the final PET film composition. The cast web was pre-heated to within a range of about 78° C. to 82° C. and stretched 3.23:1 in the machine direction. Subsequently, the film was further heated into the range about 97° C. to 103° C. and then stretched 4.3:1 in the transverse direction during a period of about 9 seconds. The heat set zone temperatures were set at an average of about 235° C. and the residence time was about 9 seconds. Upon exiting the heat set zone, the web entered a first cooling zone of about 90° C. to 100° C. followed by a second cooling zone of about 40° C. to 50° C. The time in each cooling zone was about 3 seconds. The resultant film was nominally 3 mils thick and had an opacity of about 95% and was exposed to a second brief thermal exposure of 180° C. under reduced constraint. The resultant film had shrinkage values of 0.81% in the machine direction and 1.02% in the transverse direction measured at 150° C. for 15 minutes. The net peak area as measured by DSC from endpoint of glass transition to 230° C. was −5 J/g. This film was subjected to the same damp heat test conditions of comparative example 1 and measured 13.4% at 80 days and 4.4% at 100 days PET film example 2 was made as described for PET film example 1 except that the temperature in the heat set zone was reduced to 225° C. The resultant film had a shrinkage of 1.53% in the machine direction and 1.65% in the transverse measured at 150° C. for 15 minutes. The net peak area as measured by DSC from endpoint of glass transition to 230° C. was −1.93 J/g. This film was subjected to the same damp heat test conditions of comparative example 1 and measured 47.3% at 80 days and 6.0% at 100 days PET film samples 1 and 2 were each treated to an additional heat exposure at 150° C. for 10 minutes to reduce their shrinkage to near zero percent when measured at 150° C. for 15 minutes. This additional heat treatment did not appear to affect their embrittlement life.

What is claimed is:

1. A solar panel backside film, comprising:
   a) a polyethylene terephthalate film having,
      i) a molecular structure that results from a heat set temperature and duration to achieve a net peak area as measured by differential scanning calorimetry of about −15 J/g to about 5 J/g measured from the endpoint of its glass transition point up to 230° C., and
      ii) an additive dispersion to opacify the polyethylene terephthalate film and,
   b) a polymeric layer adhered to the polyethylene terephthalate film to create a solar panel backside film, wherein the solar panel backside film has a reflectivity of 50% or greater at a point in the visible range of light, and wherein the solar panel backside film, when applied to a solar panel and exposed to 2000 hours at 85° C. and 85% relative humidity, does not result in exfoliation or in the polyethylene terephthalate film.

2. A solar panel backside film according to claim 1, wherein the net peak area as measured by differential scanning calorimetry is about −7 J/g to about 0 J/g measured from the endpoint of its glass transition up to 230° C.

3. A solar panel backside film according to claim 1, wherein the solar panel backside film exhibits after exposure to 2000 hours at 85° C. and 85% relative humidity an adhesion failure mechanism between the polyethylene terephthalate film and polymeric layer that is not cohesive within the polyethylene terephthalate film.

4. A solar panel backside film according to claim 1, wherein the reflectivity is 70% or greater at a point in the visible range of light.

5. A solar panel backside film according to claim 1, wherein the polymeric layer comprises a polyolefin.

6. A solar panel backside film according to claim 1, wherein a layer providing UV protection is applied to the outside facing surface of the solar panel backside film on a side opposing the polymeric layer.

7. A solar panel backside film according to claim 1, wherein the polymeric layer comprises a fluoropolymer.

8. A solar panel backside film according to claim 7, wherein the fluoropolymer comprises polymerized units selected from vinylfluoride, vinylidenefluoride, tetrafluoroethylene, or combinations thereof and optionally other fully fluorinated, partially fluorinated or non-fluorinated monomers.

9. A solar panel backside film according to claim 7, wherein the fluoropolymer is selected from polyvinylfluoride, polyvinylidene fluoride, ethylene-co-tetrafluoroethylene polymers, or copolymers of tetrafluoroethylene, hexafluoropropylene or vinylidene fluoride.

10. A solar panel backside film according to claim 1, wherein the solar panel backside film has a shrinkage of less than 1% measured at 150° C. when held for 15 minutes in accordance with ASTM 2305-02.

11. A solar panel backside film according to claim 1, wherein the adhesion of the polyethylene terephthalate film to the polymeric layer is at least 1 pound per linear inch after 2000 hours of exposure to 85° C. and 85% relative humidity.

12. A solar panel backside film according to claim 1, wherein the polyethylene terephthalate film exhibits an elongation to break of at least 10% after 2000 hours of exposure to 85° C. and 85% relative humidity.

13. A solar panel backside film according to claim 1, wherein the additive is present at a level of 10% by weight or greater.

14. A solar panel backside film according to claim 13, wherein the additive comprises $TiO_2$.

15. A solar panel comprising:
   a) glass,
   b) a plurality of solar cells encapsulated in a polymer and adhered to the glass; and
   c) the solar panel backside film according to claim 1 adhered to the polymer on a surface opposite the glass.

16. The solar panel according to claim 15, wherein the solar panel backside film is adjacent to the polymer.

17. A method of making a solar panel backside film, comprising
   a) providing a polyethylene terephthalate film having,
      i) a molecular structure that results from a heat set temperature and duration to achieve a net peak area, as measured by differential scanning calorimetry of about −15 J/g to about 5 J/g measured from the endpoint of its glass transition point up to 230° C., and
      ii) an additive dispersion to opacify the polyethylene terephthalate film and,
   b) applying a polymeric layer to the polyethylene terephthalate film to create a solar panel backside film, wherein the solar panel backside film has a reflectivity of 50% or greater at a point in the visible range of light, and wherein the solar panel backside film, when applied to a solar panel and exposed to 2000 hours at 85° C. and 85% relative humidity, does not result in exfoliation or in the polyethylene terephthalate film.

* * * * *